(12) United States Patent
Hu et al.

(10) Patent No.: US 9,490,422 B1
(45) Date of Patent: Nov. 8, 2016

(54) CURRENT CONSTRICTION FOR SPIN TORQUE MRAM (71) Applicant: INTERNATIONAL BUSINESS MACHINES CORPORATION, Armonk, NY (US)

(72) Inventors: Guohan Hu, Yorktown Heights, NY (US); Daniel C. Worledge, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/814,129

(22) Filed: Jul. 30, 2015

(51) Int. Cl.
*H01L 43/12* (2006.01)
*H01L 43/02* (2006.01)
*H01L 43/08* (2006.01)

(52) U.S. Cl.
CPC .............. *H01L 43/08* (2013.01); *H01L 43/02* (2013.01); *H01L 43/12* (2013.01)

(58) Field of Classification Search
CPC ........ H01L 43/02; H01L 43/08; H01L 43/12
See application file for complete search history.

(56) References Cited

U.S. PATENT DOCUMENTS

| | | | |
|---|---|---|---|
| 6,232,777 B1 | 5/2001 | Sato et al. | |
| 7,161,829 B2 | 1/2007 | Huai et al. | |
| 7,672,086 B1 | 3/2010 | Jiang | |
| 7,732,881 B2 | 6/2010 | Wang | |
| 8,198,102 B2 | 6/2012 | Nam et al. | |
| 8,456,903 B2 | 6/2013 | Tang et al. | |
| 8,823,118 B2 | 9/2014 | Horng et al. | |
| 2008/0026253 A1* | 1/2008 | Yuasa | B82Y 25/00 428/811 |

* cited by examiner

*Primary Examiner* — Daniel Shook
(74) *Attorney, Agent, or Firm* — Tutunjian & Bitetto, P.C.; Vazken Alexanian (57) ABSTRACT

Magnetoresistive random access memory (MRAM) devices and methods for making the same include growing a tunnel barrier layer on a first magnetic layer. A thin layer of non-wetting material is formed on the tunnel barrier layer, such that the non-wetting material forms distinct regions on the tunnel barrier layer. A second magnetic layer is grown on the tunnel barrier layer.

9 Claims, 6 Drawing Sheets

CURRENT CONSTRICTION FOR SPIN TORQUE MRAM

BACKGROUND

1. Technical Field

The present invention relates to magnetoresistive random access memory (MRAM) and, more particularly, to constricting switching current in the tunnel layer of MRAM devices.

2. Description of the Related Art

Spin torque magnetoresistive random access memory (MRAM) uses a two-terminal device having a pinned layer, a tunnel barrier, and a free layer in a magnetic tunnel junction stack. The magnetization of the pinned layer is fixed in a given direction (e.g., "up"), and current passed through the tunnel layer causes the free layer to assume a desired magnetization. The state of the device is then determined according to whether the free layer has a magnetization that is parallel to, or anti-parallel to, the pinned layer.

The physical mechanism employed for writing is spin torque transfer. While a general current is generally unpolarized with respect to spin, in an MRAM device the pinned layer has the effect of polarizing the electrons' spins. These electrons transfer their angular momentum to the free layer at the junction between the free layer and the tunnel layer, reinforcing or reversing the magnetization of the free layer.

A current is therefore used to set a desired polarity to the device, while a smaller current is used to read the stored polarity. The current is applied across the magnetic layers and the tunnel barrier, where the magnetic layers are conductive, but the tunnel barrier is an insulator. However, the tunnel barrier is made thin enough that electrons can pass through the barrier via quantum tunneling. The read current depends on the relative orientations of the magnetizations of the pinned and free layers, with a resistance of the device generally being higher when the magnetizations are anti-parallel and lower when the magnetizations are parallel. The switching current, being substantially larger than the read current, represents the bulk of the device's power output.

SUMMARY

A method of forming magnetoresistive random access memory (MRAM) devices include growing a tunnel barrier layer on a first magnetic layer. A thin layer of non-wetting material is formed on the tunnel barrier layer, such that the non-wetting material forms distinct regions on the tunnel barrier layer. A second magnetic layer is grown on the tunnel barrier layer.

An MRAM device includes a first magnetic layer. A tunnel barrier layer is formed on the first magnetic layer. The tunnel barrier includes first regions having a first thickness and second regions having a second thickness that is greater than the first thickness. A second magnetic layer is formed on the tunnel barrier layer.

An MRAM device includes a first magnetic layer. A tunnel barrier is formed on the first magnetic layer. The tunnel barrier includes a first layer of tunnel barrier material formed on the first magnetic layer, a layer of internal magnetic material formed in distinct regions on the first layer of tunnel barrier material, and a second layer of tunnel barrier material formed on the layer of internal magnetic material and the first layer of tunnel barrier material. A second magnetic layer is formed on the tunnel barrier.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention reduce the switching current of magnetoresistive random access memory (MRAM) devices that use spin-transfer torque to change the state of the devices. To accomplish this, the tunnel layer of the MRAM devices is designed to constrict current flow. The constricted or blocked current pathways reduce the region of the tunnel barrier through which current flows. Thus if, for example, the unblocked area of the tunnel layer is reduced by a factor of three, the current flow is also reduced by a factor of three. This is because the current density in the unblocked areas is kept the same as in embodiments lacking current constriction. The unblocked regions will switch the magnetization of the free layers as before, and that brings along the entire free layer, such that the device operates as normal.

To accomplish this, the blocked areas are created with a resistance that is at least about five times greater than a resistance of the unblocked areas, and preferably at least ten times greater. The current flow through the blocked areas is thereby minimized and the current primarily flows through the unblocked regions. Because the free layer of the device is not changed, the activation energy, which determines the retention time, is not changed. Thus the switching current is reduced without reducing the activation energy.

Figure 1:
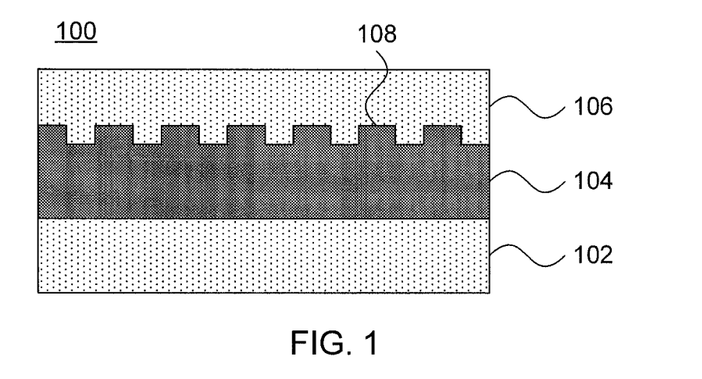
FIG. 1 is a cross-sectional view of a magnetic tunnel junction device with constricted current in accordance with the present principles.

Referring now to the drawings in which like numerals represent the same or similar elements and initially to FIG. 1, a cross-section of an MRAM device 100 with constricted current area is shown. A pinned layer 102 has a fixed or permanent magnetization. A tunnel layer 104 is formed on the fixed layer with regions 108 of higher resistance. The tunnel layer 104 interfaces with the free layer 106. Current is applied vertically. As currents pass through the tunnel layer 104 by way of electron tunneling, the current flow is constricted to avoid the regions 108 of higher resistance.

Relative to an embodiment without such blocked regions 108, the current density in unblocked regions is the same, but the total current flow is reduced. The pinned layer 102 and the free layer 106 are both formed from magnetic materials. The free layer 106 may be formed from CoFe or CoFeB at the interface with the tunnel layer 104. The pinned layer 102 may be formed from CoFeB, CoFe, or a combination of CoFe, CoFeB, Co/Ni multilayers, Co/Pd multilayers, and Co/Pt multilayers. The tunnel barrier layer 104 may be formed from magnesium oxide, aluminum oxide, a composite of the two, or any other suitable insulating material.

In one embodiment, the blocked regions 108 are formed by increasing the thickness of the tunnel barrier layer 104. Tunneling resistance increases exponentially with the thickness of the tunnel barrier 104, such that a small increase in thickness can produce a significant increase in resistance. This may be accomplished by depositing a first tunnel layer material followed by a second, non-wetting tunnel layer material. The second material forms islands on the first material, creating localized areas of increased thickness 108 in the tunnel layer 104. These areas of increased thickness 108 may be formed in any pattern and at any density to produce a device current according to design specifications. Because the resistance of the tunnel layer 104 grows exponentially with the thickness of the tunnel layer 104, current is constricted from flowing in the thicker blocked regions 108.

The second material may be any appropriate non-wetting metal or semiconductor having an equivalent thickness (the thickness if it did wet the surface) between about 0.1 nm and 0.5 nm. In one specific example, the first portion of the tunnel layer 104 is formed from about 0.8 nm of magnesium oxide and the second portion is formed from about 0.2 nm of aluminum. The aluminum forms islands on the magnesium oxide surface, leaving other parts of the magnesium oxide surface exposed. It should be understood that other materials may be employed. For example, instead of aluminum, calcium, titanium, vanadium, hafnium, silicon, zinc, gallium, or germanium or other materials may be used. The second material is oxidized after deposition to turn it into an insulator if it is otherwise conductive. In the above example, oxidation turns the conductive aluminum metal into an insulating aluminum oxide. In this fashion the second material increases the local thickness of the tunnel layer 104.

An additional layer of the first tunnel barrier material may optionally be deposited over the second material. This can be helpful in obtaining desired magnetoresistance qualities in the device if too large an amount of the second material is used, as the magnetoresistive properties of different materials can differ substantially. If a large amount of the second material is used, interlacing that material directly with the free layer 106 could impair the functioning of the device 100.

Figure 2:
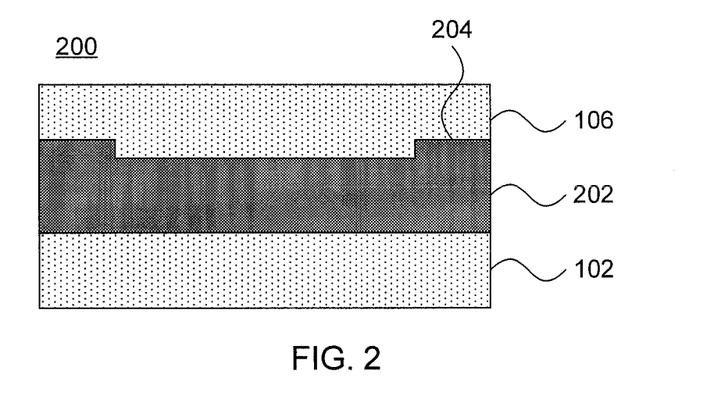
FIG. 2 is a cross-sectional view of a magnetic tunnel junction device with constricted current in accordance with the present principles.

Referring now to FIG. 2, a cross-section of an alternative embodiment of an MRAM device 200 with constricted current area is shown. In this embodiment, the tunnel material 202 is formed with material around the edge 204 that is treated to increase its thickness. In one example, the edge may be oxidized to increase its thickness. This produces a device 200 where the current is constricted to flow through the center of the tunnel layer 202. The size of the thickened edge 204 can be increased arbitrarily to cover as much of the tunnel layer 202 as needed to meet design specifications. Alternatively, the edge may be thinned, such that current flow is constricted to only the outer edge of the tunnel layer 202.

Figure 3:
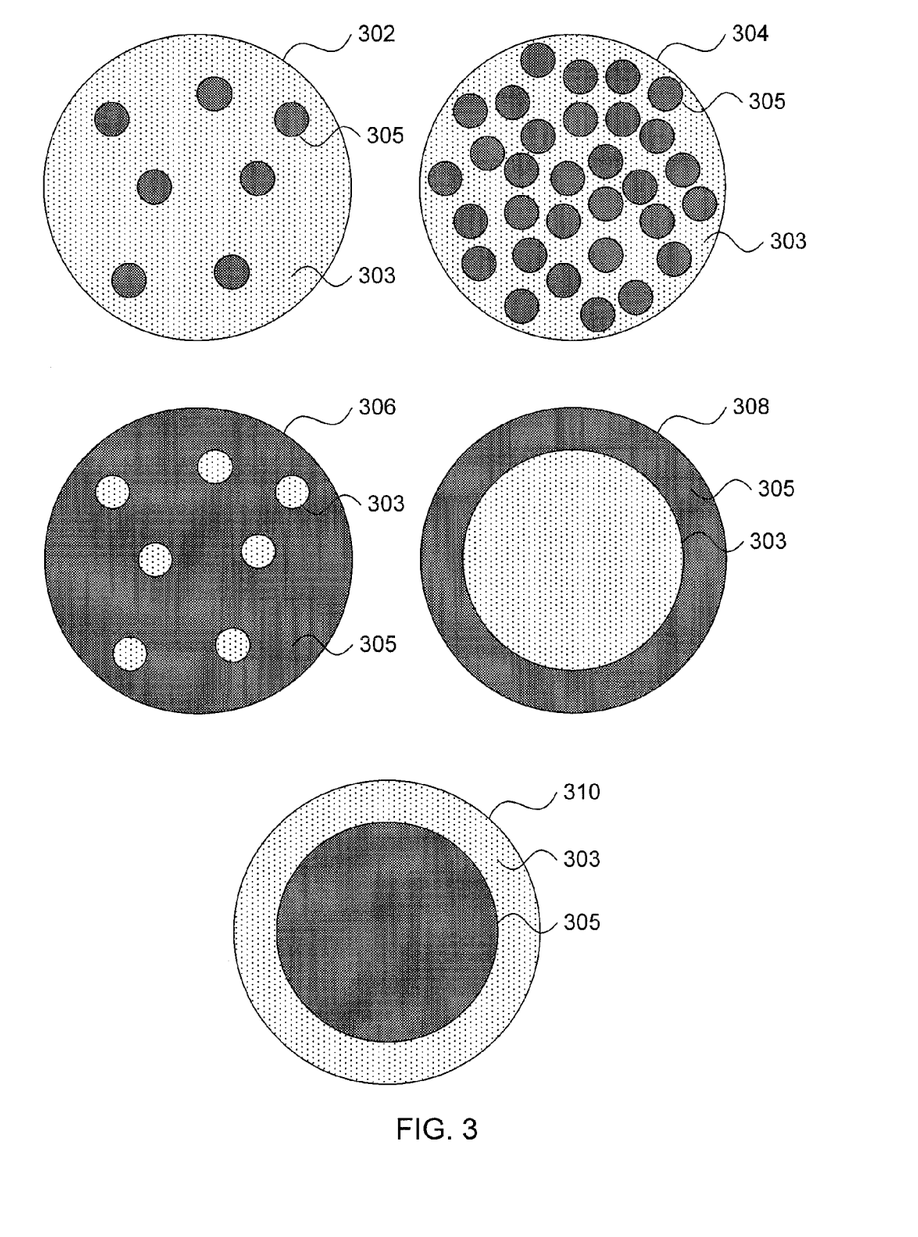
FIG. 3 is a top-down view of a tunnel barrier layer with constricted current in accordance with the present principles.

Referring now to FIG. 3, a set of top-down views of the tunnel junction layer of different MRAM devices is shown, each having different patterns of blocked regions. In a first example 302, regions of increased thickness 305 are sparsely arrayed on the thinner portions 303 of the tunnel junction, resulting in a modestly constrained current. In a second example 304, the regions of increased thickness 305 are more densely arranged, such that current constriction is increased. In the third example 306, a majority of the tunnel layer is thicker region 305, while only sparse regions 303 are left relatively thin to allow current to flow. In this manner, the current can be constrained to an arbitrarily small area.

In a fourth example 308, the thickened region 305 is confined edges of the tunnel layer, leaving the thinner portions 303 in the center of the tunnel layer where current may flow. In a fifth example 310, the thinner region 303 is at the edge while the thicker region 305 is on the inside, such that current flows only around the outer edge of the tunnel layer. The edge of the tunnel layer may be thickened using, e.g., oxidation or thinned using, e.g., hydrogen treatment.

It should be noted that the resistance of the tunnel barrier is a design aspect of a circuit that may be set by external factors. Constraining the current to pass through limited areas increases the overall resistance of the tunnel barrier. To compensate for this, the overall tunnel barrier itself may be made thinner to compensate, allowing a circuit designer to achieve any amount of resistance needed.

Figure 4:
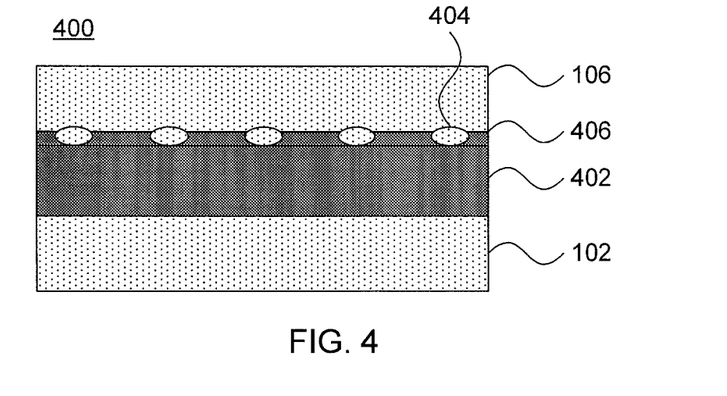
FIG. 4 is a cross-sectional view of a magnetic tunnel junction device with constricted current in accordance with the present principles.

Referring now to FIG. 4, a cross-section of an alternative embodiment of an MRAM device 400 with constricted current area is shown. In this embodiment, a first layer 402 of tunnel barrier material is deposited. Non-wetting magnetic layer material 404 is deposited on the bottom tunnel layer 402 and allowed to form into islands. An additional layer 406 of tunnel barrier material is formed around the islands 404. The top layer of magnetic material 106 is then formed over the islands 404 to complete the device. Thus in this embodiment, the application of a non-wetting material on the initial tunnel layer 402 to form islands is used to produce localized thinning of the overall tunnel barrier, as the additional tunnel barrier material 406 is used to thicken the tunnel barrier in other regions. It should be understood that the magnetic material used to form the islands 404 may be of the same magnetic material as the top layer 106 or may be a different material selected for the properties of its interaction with the tunnel barrier material. It should be noted that a non-magnetic conduct is not optimal for this purpose—while it would provide localized current flow between the lower layer 102 and the upper layer 106, the lack of magnetoresistance in such a conductor would reduce the total magnetoresistance of the device for read operations.

Because the resistance of the tunnel barrier layer as a whole increases exponentially with thickness, as a result of the quantum tunneling process that allows conductivity through the barrier, the regions of the tunnel barrier layer that include the islands 404 exhibit a lower resistance than the other regions. This embodiment can provide a uniform upper surface having a consistent material profile, in contrast to the above embodiments, which have an uneven surface and use different materials on the junction between the tunnel layer and the upper magnetic layer.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, a well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 5:
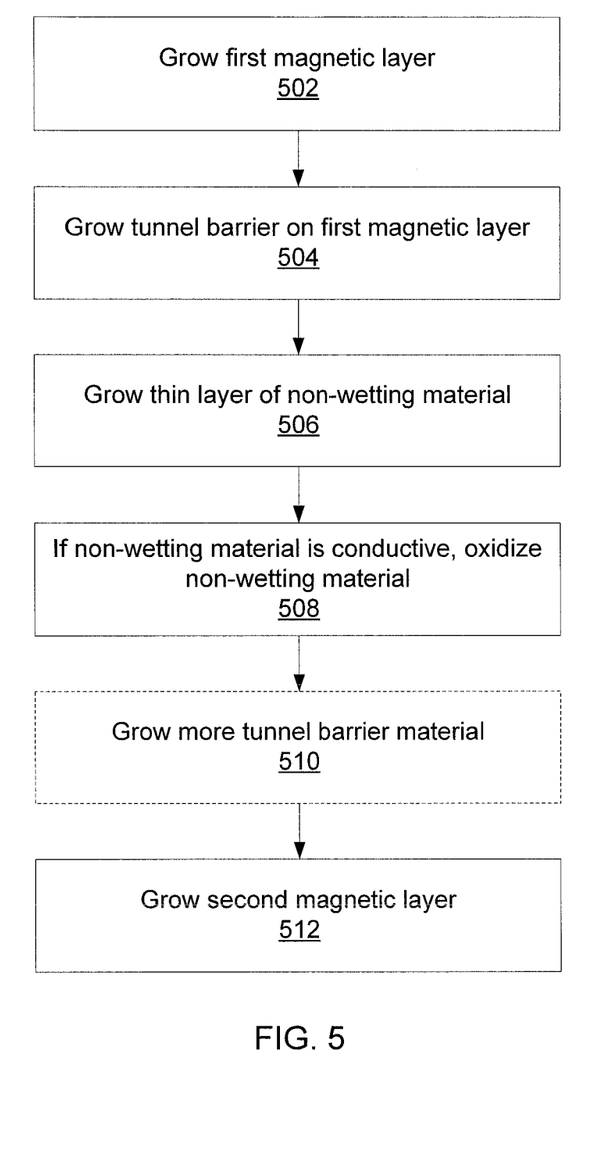
FIG. 5 is a block/flow diagram of a method of forming a magnetic tunnel junction device with constricted current in accordance with the present principles.

Referring now to FIG. 5, a method of fabricating an MRAM device is shown. Block 502 grows the first magnetic layer 102 using any appropriate fabrication technique. Block 504 grows the tunnel barrier layer 104 on the first magnetic layer 102. As described above, the tunnel barrier layer 104 may be formed with an exemplary thickness of about 0.8 nm. Block 506 grows a thin layer of non-wetting material on the tunnel barrier layer 104, allowing the non-wetting material to form islands 106. The non-wetting material may be an insulator, or may be a metal or semiconductor material. The islands may be formed with an exemplary thickness of about 0.1 nm to about 0.5 nm, in accordance with the desired electrical properties of the device. If the non-wetting material is conductive or a semi-conductor, block 508 oxidizes the non-wetting material to make it an insulator. Block 510 optionally forms additional tunnel barrier material over the islands 106 and block 512 grows the second magnetic layer 106 over the tunnel barrier layer 104. Typically these materials may be formed using, e.g., a physical vapor deposition process such as magnetron sputtering.

Figure 6:
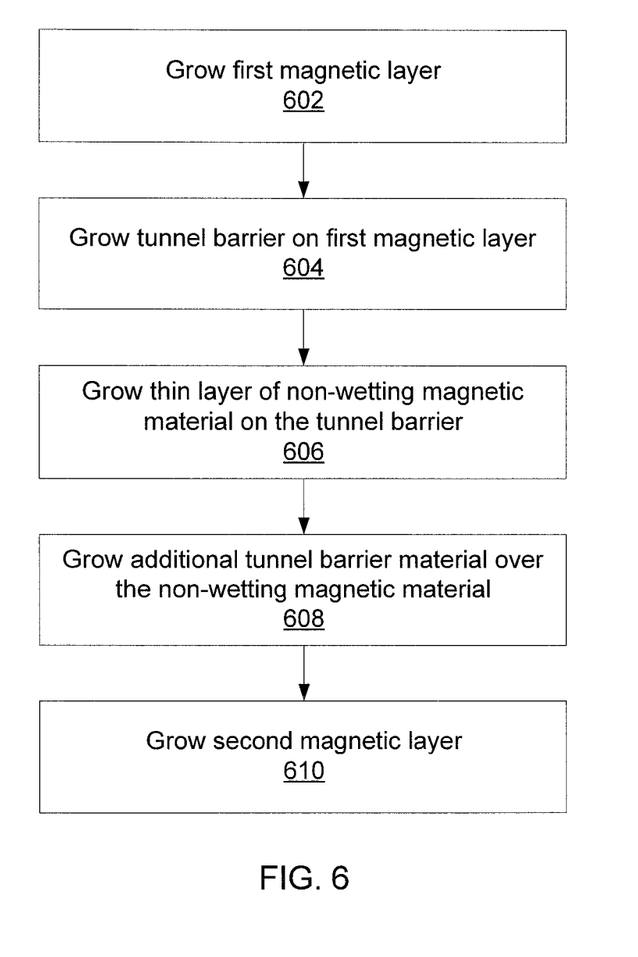
FIG. 6 is a block/flow diagram of a method of forming a magnetic tunnel junction device with constricted current in accordance with the present principles.

Referring now to FIG. 6, a method of fabricating an MRAM device is shown. Block 602 grows the first magnetic layer 102 using any appropriate fabrication technique. Block 604 grows a first tunnel barrier layer 402 on the first magnetic layer 102. Block 606 grows a thin layer of non-wetting magnetic material on the first tunnel barrier layer 402 to form islands 404. Block 608 grows an additional tunnel barrier layer 406 over the islands 404 and block 610 grows the second magnetic layer 106 over the second tunnel barrier layer 406.

Figure 7:
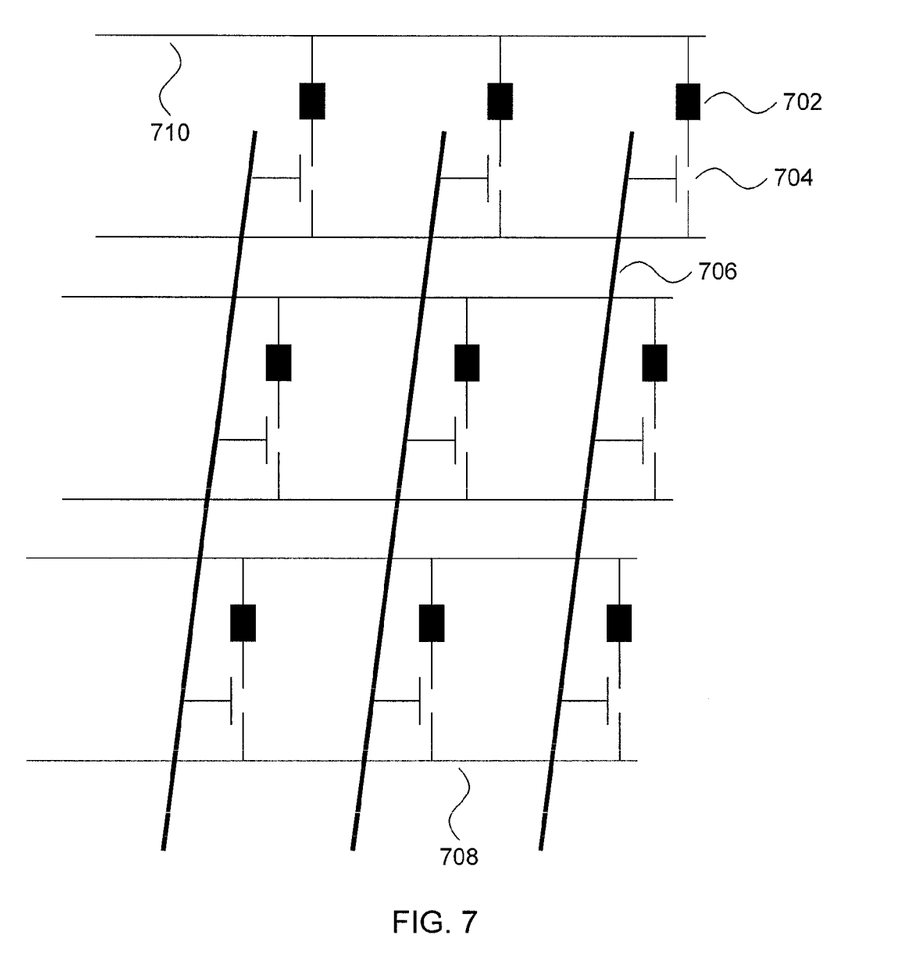
FIG. 7 is a diagram of an array of magnetic tunnel junction devices in accordance with the present principles.

Referring now to FIG. 7, an array of MRAM devices is shown. Each magnetic tunnel junction 702 is connected to a respective transistor 704 that controls reading and writing. A word line 706 provides data to write to the magnetic tunnel junctions 702, while a bit line 710 and a bit line complement 708 read data from the magnetic tunnel junction 702. In this manner, a large array of memory devices can be implemented on a single chip. An arbitrarily large number of MRAM devices can be employed, within the limits of the manufacturing processes and design specifications.

Having described preferred embodiments of current constriction for spin torque MRAM (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a magnetoresistive random access memory (MRAM) device, comprising:
    growing a tunnel barrier layer on a first magnetic layer;
    growing a thin layer of non-wetting material on the tunnel barrier layer, such that the non-wetting material forms distinct regions on the tunnel barrier layer; and
    growing a second magnetic layer on the tunnel barrier layer.

2. The method of claim 1, further comprising growing additional tunnel material over the thin layer of non-wetting material.

3. The method of claim 1, wherein growing the thin layer of non-wetting material comprises growing an insulator material.

4. The method of claim 1, wherein growing the thin layer of non-wetting material comprises growing a metal or semiconductor.

5. The method of claim 4, further comprising oxidizing the thin layer of non-wetting material before growing the second magnetic layer.

6. The method of claim 1, wherein growing the thin layer of non-wetting material comprises growing a magnetic layer.

7. The method of claim 6, further comprising growing additional tunnel material over the thin layer of non-wetting material before growing the second magnetic layer.

8. The method of claim 1, wherein the distinct regions are islands on the surface of the tunnel barrier layer.

9. The method of claim 1, wherein the distinct regions include a ring around an edge of the tunnel barrier layer.

\* \* \* \* \*